United States Patent
Stanhope et al.

(10) Patent No.: US 11,506,723 B2
(45) Date of Patent: Nov. 22, 2022

(54) SYSTEM AND METHOD FOR MONITORING THE OPERATIONAL STATUS OF TOOLS OF AN AGRICULTURAL IMPLEMENT UTILIZING CONNECTIVITY

(71) Applicant: CNH Industrial America LLC, New Holland, PA (US)

(72) Inventors: Trevor Stanhope, Palos Hills, IL (US); Joshua David Harmon, Leola, PA (US)

(73) Assignee: CNH Industrial America LLC, New Holland, PA (US)

( * ) Notice: Subject to any disclaimer, the term of this patent is extended or adjusted under 35 U.S.C. 154(b) by 458 days.

(21) Appl. No.: 16/590,603

(22) Filed: Oct. 2, 2019

(65) Prior Publication Data
US 2021/0102984 A1  Apr. 8, 2021

(51) Int. Cl.
*G01R 31/00* (2006.01)
*A01B 76/00* (2006.01)
(Continued)

(52) U.S. Cl.
CPC .............. *G01R 31/50* (2020.01); *A01B 13/08* (2013.01); *A01B 76/00* (2013.01); *A01B 49/027* (2013.01)

(58) Field of Classification Search
CPC ........ G01R 31/50; G01R 31/52; G01R 31/54; G01R 31/66; A01B 13/08; A01B 76/00
See application file for complete search history.

(56) References Cited

U.S. PATENT DOCUMENTS

| 2,113,666 A | 4/1938 | Suman |
| 2,124,965 A | 7/1938 | Lind |

(Continued)

FOREIGN PATENT DOCUMENTS

| CN | 102289644 A | 12/2011 |
| CN | 103630282 A | 3/2014 |

(Continued)

OTHER PUBLICATIONS

Bringing Internet of Things to Bolted Connections—StrainLabs, dated Oct. 17, 2018 (4 pages) https://strain-labs.com/bringing-internet-of-things-to-bolted-connections/.
(Continued)

*Primary Examiner* — Tara Mayo-Pinnock
(74) *Attorney, Agent, or Firm* — Rebecca Henkel; Rickard DeMille

(57) ABSTRACT

A system for monitoring the operational status of ground-engaging tools of an agricultural implement. The system includes a frame and an assembly including an attachment structure configured to be coupled to the frame and a ground-engaging tool. The ground-engaging tool is pivotably coupled to the attachment structure. The system further includes a shear pin at least partially extending through both the attachment structure and ground-engaging tool to prevent pivoting of the ground-engaging tool about the pivot point when the shear pin is in an operable working condition. Additionally, the system includes an electrical connection through one or more components of the assembly or the shear pin and associated with the shear pin. The system further includes a controller electrically coupled to the electrical connection. The controller is configured to determine a change in the working condition of the shear pin based on an electrical property of the electrical connection.

20 Claims, 8 Drawing Sheets

(51) Int. Cl.
*A01B 13/08* (2006.01)
*G01R 31/50* (2020.01)
*A01B 49/02* (2006.01)

(56) References Cited

U.S. PATENT DOCUMENTS

| | | | |
|---|---|---|---|
| 3,704,459 | A | 11/1972 | Young |
| 4,246,456 | A | 1/1981 | Leonard |
| 4,934,611 | A | 6/1990 | Lewis |
| 5,017,912 | A | 5/1991 | Willis |
| 5,142,914 | A | 9/1992 | Kusakabe et al. |
| 6,276,916 | B1 | 8/2001 | Schad et al. |
| 6,556,143 | B2 | 4/2003 | Noah |
| 7,009,123 | B2 | 3/2006 | Banville et al. |
| 7,324,882 | B2 | 1/2008 | Heinsey et al. |
| 7,324,883 | B2 * | 1/2008 | Heinsey et al. ........ A01F 12/18 460/107 |
| 7,353,723 | B2 | 4/2008 | Lardy et al. |
| 7,392,123 | B2 | 6/2008 | Heinsey et al. |
| 7,412,898 | B1 | 8/2008 | Smith et al. |
| 7,973,671 | B2 | 7/2011 | Cloutier et al. |
| 8,596,134 | B2 | 12/2013 | Mekid et al. |
| 8,810,370 | B2 | 8/2014 | Tillotson et al. |
| 9,144,199 | B2 | 9/2015 | Ritter et al. |
| 9,429,485 | B1 | 8/2016 | Cavallaro |
| 9,483,674 | B1 | 11/2016 | Fink et al. |
| 9,547,783 | B2 | 1/2017 | Lewis et al. |
| 9,645,061 | B2 | 5/2017 | Hsieh |
| 9,677,592 | B2 | 6/2017 | Bernhardt |
| 9,952,129 | B2 | 4/2018 | Kondo |
| 2001/0048369 | A1 | 12/2001 | Noah |
| 2004/0252029 | A1 * | 12/2004 | Banville et al. ........ G01R 31/54 340/6.1 |
| 2006/0003846 | A1 | 1/2006 | Burger et al. |
| 2017/0196160 | A1 | 7/2017 | Bjerketvedt et al. |
| 2017/0321552 | A1 | 11/2017 | Gustafsson |
| 2018/0073542 | A1 | 3/2018 | Saigo et al. |
| 2018/0155132 | A1 | 6/2018 | Li et al. |

FOREIGN PATENT DOCUMENTS

| | | |
|---|---|---|
| CN | 204166662 U | 2/2015 |
| CN | 204256887 U | 4/2015 |
| CN | 104614775 A | 5/2015 |
| EP | I557588 A1 | 7/2005 |
| JP | S 57191472 A | 11/1982 |
| JP | H 04204394 A | 7/1992 |
| JP | 2014109457 A | 6/2014 |
| JP | 6259203 B2 | 1/2018 |
| WO | WO 2009116966 | 9/2009 |
| WO | WO 2018/030942 | 2/2018 |

OTHER PUBLICATIONS

Real Time Shank Bolt Detection, Shank Patrol, dated Oct. 22, 2018 (3 pages) https://shankpatrol.com/.

"Why Settle for Only One or Two Axes?" Design News 63.14, Cahners Publishing Co, Dated Oct. 6, 2008 (2 pages) http://dialog.proquest.com/professional/docview/743564886?accountid=157282.

* cited by examiner

SYSTEM AND METHOD FOR MONITORING THE OPERATIONAL STATUS OF TOOLS OF AN AGRICULTURAL IMPLEMENT UTILIZING CONNECTIVITY

FIELD

The present disclosure generally relates to agricultural implements and, more particularly, to systems and methods for monitoring the operational status of ground-engaging tools of an agricultural implement utilizing the presence of an electrical connection associated with the ground-engaging tools.

BACKGROUND

It is well known that, to attain the best agricultural performance from a field, a farmer must occasionally cultivate the soil, typically through a tillage operation. Modern farmers perform tillage operations by pulling a tillage implement behind an agricultural work vehicle, such as a tractor. Tillage implements typically include a plurality of ground-engaging tools configured to penetrate the soil to a particular depth. In this respect, the ground-engaging tools may be pivotally coupled to a frame of the tillage implement. In many instances, biasing elements, such as springs, are used to exert biasing forces on the ground-engaging tools. This configuration may allow the ground-engaging tools to be biased towards a desired position relative to the frame, thereby maintaining the particular depth of soil penetration as the agricultural work vehicle pulls the tillage implement through the field. Additionally, this configuration may also permit the ground-engaging tools to pivot out of the way of rocks or other impediments in the soil, thereby preventing damage to the ground-engaging tools or other components on the implement.

In addition to such biasing elements, tillage implements often utilize a shear-bolt mounting arrangement in which shear pins or bolts are used to couple the ground-engaging tools to the frame or associated attachment structure. In such an embodiment, the shear pins serve to protect the ground-engaging tools from excessive loading that would otherwise substantially damage or break the tools. For instance, such a configuration may allow a ground-engaging tool to pivot out of the way of rocks or other impediments in the soil when the adjustability provided by the associated biasing element is insufficient.

When a shear pin breaks during the performance of an agricultural operation, the associated ground-engaging tool typically will no longer be capable of effectively working the soil. However, with current implement configurations, it is often very difficult for the operator to determine when one or more of the shear pins have failed while performing a tillage operation. As such, an extensive portion of the field may have been worked before discovering the broken shear pints).

Accordingly, an improved system and method for monitoring the operational status of ground-engaging tools, such as a change in the working condition of a shear pin associated with a ground-engaging tool, as the agricultural implement is moved across a field would be welcomed in the technology.

BRIEF DESCRIPTION

Aspects and advantages of the technology will be set forth in part in the following description, or may be obvious from the description, or may be learned through practice of the technology.

In one aspect, the present subject matter is directed to a system for monitoring the operational status of ground-engaging tools of an agricultural implement. The system includes a frame and an assembly including an attachment structure configured to be coupled to the frame and a ground-engaging tool. Moreover, the ground-engaging tool is pivotably coupled to the attachment structure at a pivot point. The system further includes a shear pin at least partially extending through both the attachment structure and ground-engaging tool to prevent pivoting of the ground-engaging tool about the pivot point when the shear pin is in an operable working condition. Additionally, the system includes an electrical connection through one or more components of the assembly or the shear pin and associated with the shear pin. The system further includes a controller electrically coupled to the electrical connection. The controller is configured to determine a change in the working condition of the shear pin based on an electrical property of the electrical connection.

In another aspect, the present subject matter is directed to a method of monitoring the operational status of a ground-engaging tool pivotally coupled to a frame of an agricultural implement at a pivot point. Moreover, the ground-engaging tool is coupled to the frame via an attachment structure. Further, a shear pin at least partially extends through the ground-engaging tool and the attachment structure. The method includes monitoring, with a computing device, an electrical property of an electrical connection through one or more components of the attachment structure, the ground-engaging tool; or the shear pin as the agricultural implement is moved across a field during the performance of an agricultural operation. The method also includes comparing, with the computing device, the monitored electrical property to a predetermined threshold defined in association with the ground-engaging tool. The method further includes determining, with the computing device, a working condition of the shear pin based at least in part on the comparison between the monitored electrical property and the predetermined threshold.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art; is set forth in the specification, which makes reference to the appended figures, in which.

Figure 1:
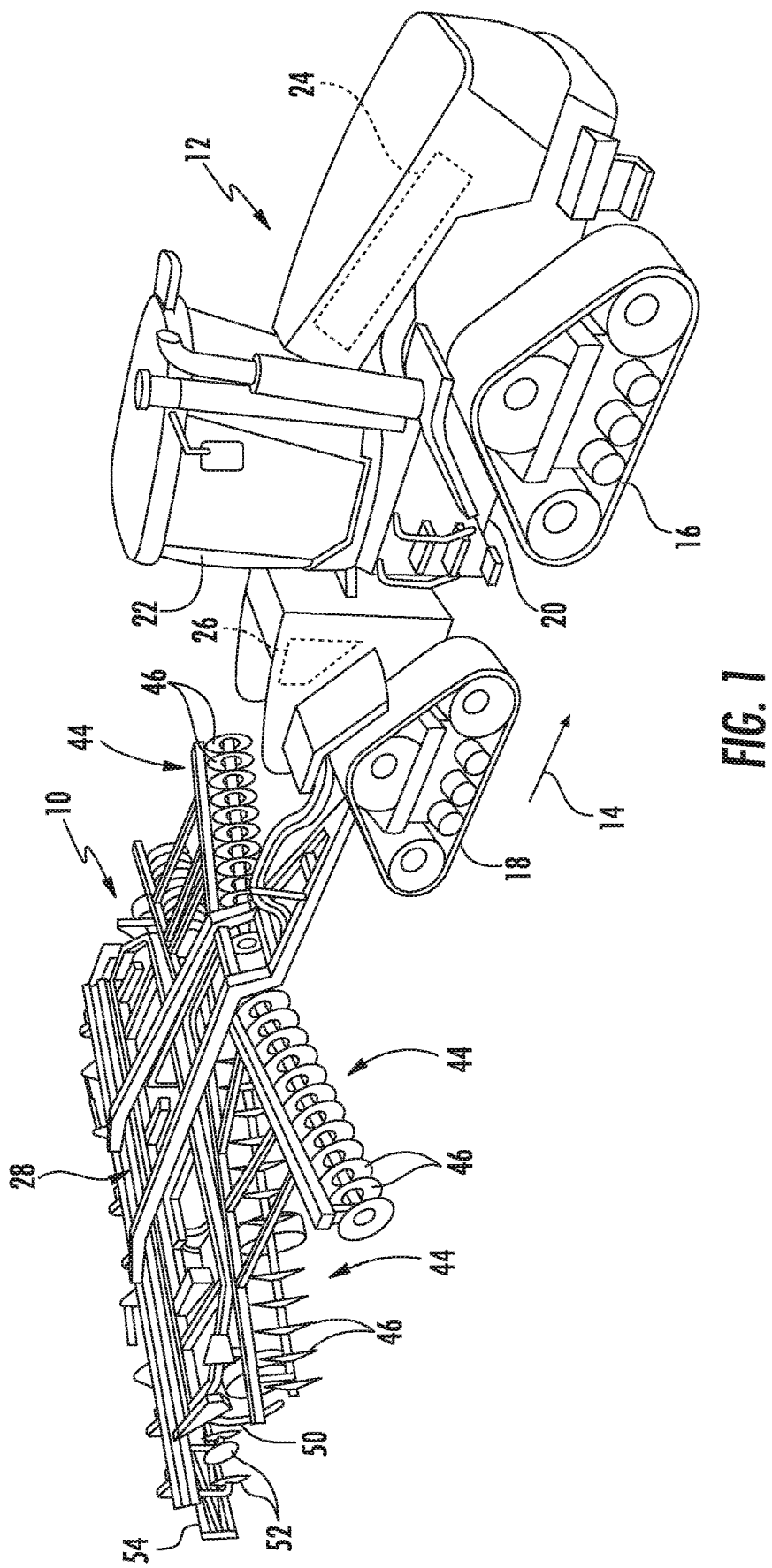
FIG. 1 illustrates a perspective view of one embodiment of an agricultural implement coupled to a work vehicle in accordance with aspects of the present subject matter.

Repeat use of reference characters in the present specification and drawings is intended to represent the same or analogous features or elements of the present technology.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to systems and methods for monitoring the operational status of ground-engaging tools of an agricultural implement. Specifically, in several embodiments, the disclosed system may be utilized to monitor the operational status of ground-engaging tools, such as shanks, configured to be pivotally coupled to a frame of an agricultural implement, in which a shear pin or bolt extends through the tool to prevent pivoting of the tool relative to the frame or a component attached to the frame during normal loading conditions. For example, in accordance with aspects of the present subject matter, the disclosed system may include an electrical connection through the shear pin, a shank assembly, or the shank of the shank assembly. As will be described below, a controller of the system may be configured to monitor an electrical property of the electrical connection to determine a change in a working condition of the ground-engaging tool. For instance, the controller may be configured to utilize the monitored electrical property to determine when the shear pin associated with the tool has sheared off or otherwise failed. In such instance, the controller may, for example, be configured to alert an operator of the agricultural implement of the change in the working condition of the ground-engaging tool to allow the operator to take whatever action he/she deems appropriate. Furthermore, the controller may, for instance, be configured to determine a qualitative or quantitative indicator of the effectiveness of the agricultural operation based on the working condition of one or more of the ground-engaging tools.

Figure 2:
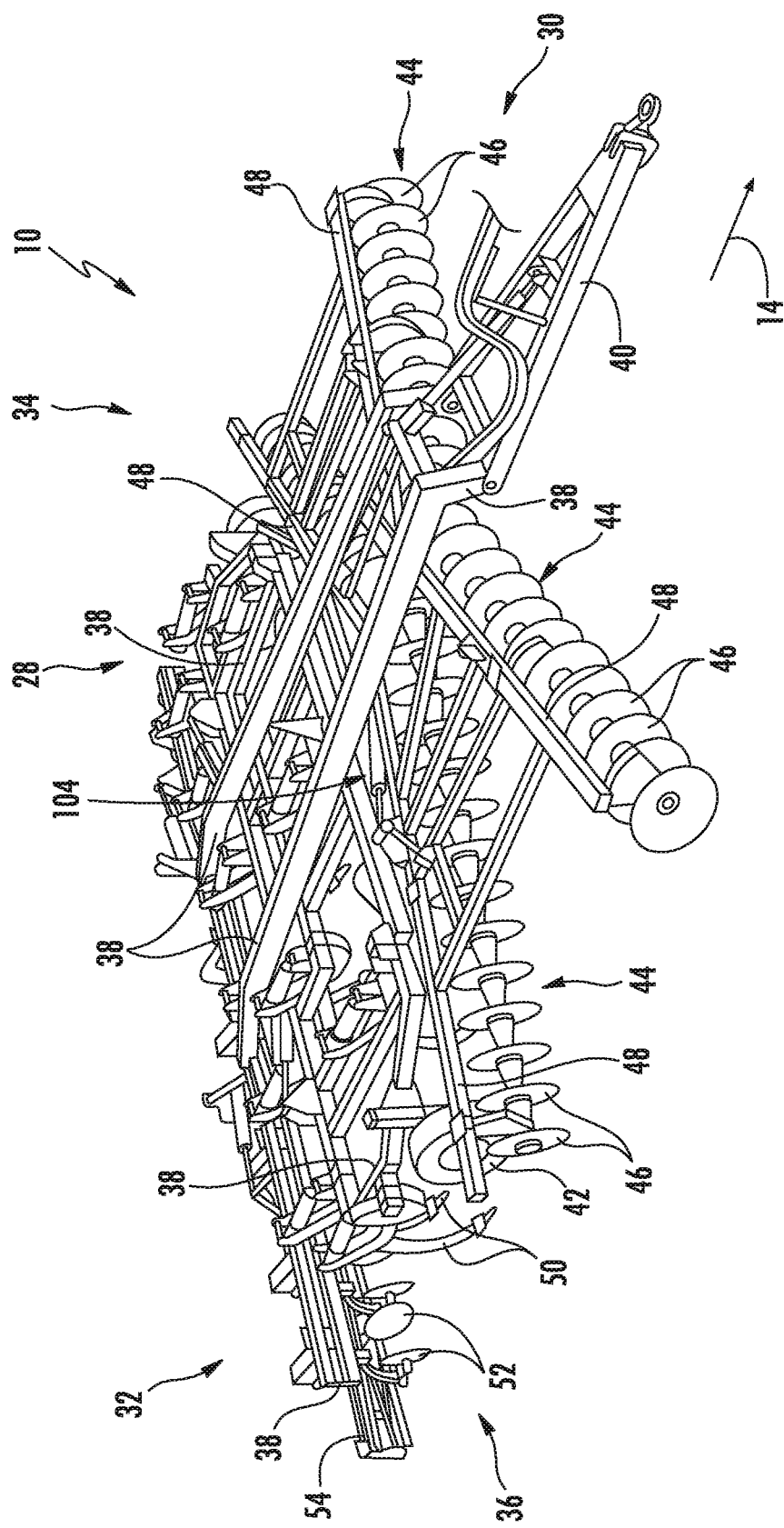
FIG. 2 illustrates an alternative perspective view of an agricultural implement in accordance with aspects of the present subject matter, particularly illustrating various components of the implement.

Referring now to the drawings. FIGS. 1 and 2 illustrate differing perspective views of one embodiment of an agricultural implement 10 in accordance with aspects of the present subject matter. Specifically, FIG. 1 illustrates a perspective view of the agricultural implement 10 coupled to a work vehicle 12. Additionally, FIG. 2 illustrates a perspective view of the implement 10, particularly illustrating various components of the implement 10.

In general, the implement 10 may be configured to be towed across a field in a direction of travel (e.g., as indicated by arrow 14 in FIG. 1) by the work vehicle 12. As shown, the implement 10 may be configured as a tillage implement, and the work vehicle 12 may be configured as an agricultural tractor. However, in other embodiments, the implement 10 may be configured as any other suitable type of implement, such as a seed-planting implement, a fertilizer-dispensing implement, and/or the like. Similarly, the work vehicle 12 may be configured as any other suitable type of vehicle, such as an agricultural harvester, a self propelled sprayer, and/or the like.

As shown in FIG. 1, the work vehicle 12 may include a pair of front track assemblies 16, a pair of rear track assemblies 18, and a frame or chassis 20 coupled to and supported by the track assemblies 16, 18. An operator's cab 22 may be supported by a portion of the chassis 20 and may house various input devices (e.g., a user interface 102) for permitting an operator to control the operation of one or more components of the work vehicle 12 and/or one or more components of the implement 10. Additionally, as is generally understood, the work vehicle 12 may include an engine 24 and a transmission 26 mounted on the chassis 20. The transmission 26 may be operably coupled to the engine 24 and may provide variably adjusted gear ratios for transferring engine power to the track assemblies 16, 18 via a drive axle assembly (not shown) (or via axles if multiple drive axles are employed).

As shown particularly in FIG. 2, the implement 10 may include a frame 28. More specifically, the frame 28 may extend longitudinally between a forward end 30 and an aft end 32. The frame 28 may also extend laterally between a first side 34 and a second side 36. In this respect, the frame 28 generally includes a plurality of structural frame members 38, such as beams, bars, and/or the like, configured to support or couple to a plurality of components. Furthermore, a hitch assembly 40 may be connected to the frame 28 and configured to couple the implement 10 to the work vehicle 12. Additionally, a plurality of wheels 42 (one is shown in FIG. 2) may be coupled to the frame 28 to facilitate towing the implement 10 in the direction of travel 14.

In several embodiments, one or more ground-engaging tools may be coupled to and/or supported by the frame 28. In such embodiments, the ground-engaging tool(s) may, for example, include one or more ground-penetrating tools. More particularly, in certain embodiments, the ground-engaging tools may include one or more shanks 50 and/or disc blades 46 supported relative to the frame 28. In one embodiment, each shank 50 and/or disc blade 46 may be individually supported relative to the frame 28. Alternatively, one or more groups or sections of the ground-engaging tools may be ganged together to form one or more ganged tool assemblies, such as the disc gang assemblies 44 shown in FIGS. 1 and 2.

As illustrated in FIG. 2, each disc gang assembly 44 includes a toolbar 48 coupled to the implement frame 28 and a plurality of disc blades 46 supported by the toolbar 48 relative to the implement frame 28. Each disc blade 46 may, in turn, be configured to penetrate into or otherwise engage the soil as the implement 10 is being pulled through the field. As is generally understood, the various disc gang assemblies 44 may be oriented at an angle relative to the direction of travel 14 to promote more effective tilling of the soil. In the embodiment shown in FIGS. 1 and 2, the implement 10 includes four disc gang assemblies 44 supported on the frame 28 at a location forward of the shanks 50, such as by including two forward disc gang assemblies 44 and two rear disc gang assemblies 44 positioned adjacent to the forward end 30 of the implement 10. However, it should be appreciated that, in alternative embodiments, the implement 10 may include any other suitable number of disc gang assemblies 44, such as more or fewer than four disc gang assemblies 44. Furthermore, in one embodiment, the disc gang assemblies 44 may be mounted to the frame 28 at any other suitable location, such as adjacent to its aft end 32. Moreover, in several embodiments, the implement 10 may include a plurality of disc gang actuators 104 (one is shown in FIG. 2), with each actuator 104 being configured to move or otherwise adjust the orientation or position of one of the disc gang assemblies 44 relative to the implement frame 28.

It should be appreciated that, in addition to the shanks 50 and the disc blades 46, the implement frame 28 may be configured to support any other suitable ground-engaging tools. For instance, in the illustrated embodiment, the frame 28 is also configured to support a plurality of leveling blades 52 and rolling (or crumbler) basket assemblies 54. In other embodiments, any other suitable ground-engaging tools may be coupled to and supported by the implement frame 28, such as a plurality closing discs.

It should be appreciated that the configuration of the implement 10 described above and shown in FIGS. 1 and 2 is provided only to place the present subject matter in an exemplar/field of use. Thus, it should be appreciated that the present subject matter may be readily adaptable to any manner of implement configuration.

Figure 3:
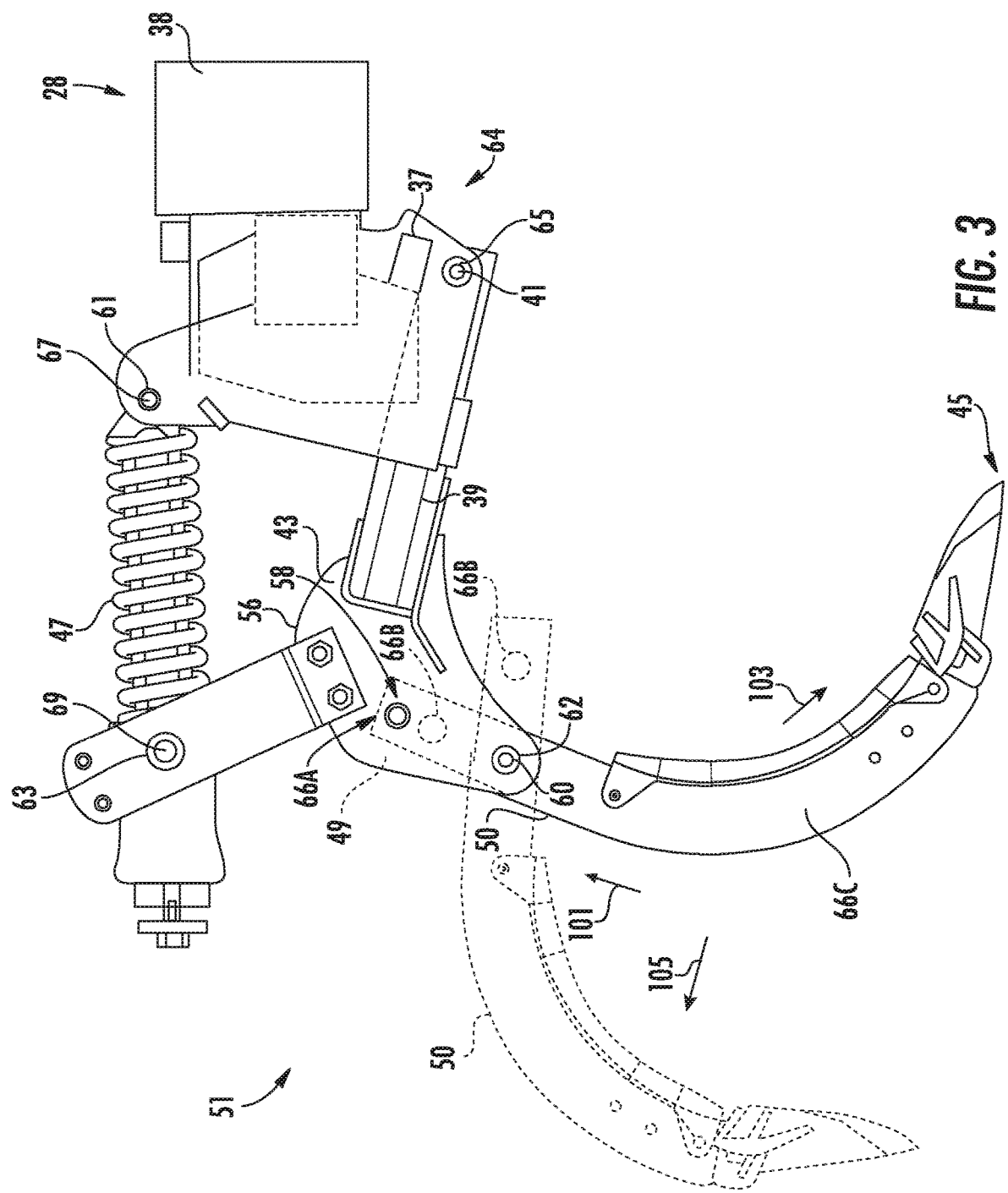
FIG. 3 illustrates a side view of one embodiment of a shank assembly including a shank pivotally coupled to an implement frame in accordance with aspects of the present subject matter, particularly illustrating a shear pin extending through the shank.

Referring now to FIG. 3, a side-view of a shank assembly 51 including one of the shanks 50 of the tillage implement 10 described above with reference to FIGS. 1 and 2 is illustrated in accordance with aspects of the present subject matter. As shown in the illustrated embodiment, the shank assembly 51 includes both the shank 50 and associated attachment structure (e.g., first and second attachment structures 39, 56) for pivotally coupling the shank 50 to the implement frame 28 (e.g., at a first pivot point 41). For instance, the shank 50 may be sandwiched between a first attachment member 43 and a second attachment member 49 (represented by a dashed line in FIG. 3) of the second attachment structure 56. As shown in FIG. 3, the shank 50 may include a tip end 45 that is configured to penetrate into or otherwise engage the ground as the implement 10 is being pulled through the field. In one embodiment, the shank 50 may be configured as a chisel. However, one of ordinary skill in the art would appreciate that the ground-engaging tool may be configured as a sweep, tine, or any other suitable ground-engaging tool. It should also be appreciated an auxiliary attachment may also be coupled to the shank 50 at its tip end 45, such as a point attachment.

As shown in FIG. 3, in several embodiments, a biasing element 47 may be coupled between the frame 28 and the shank assembly 51 to bias the shank 50 to a predetermined ground-engaging tool position (e.g., a home or base position) relative to the frame 28. In general, the predetermined ground-engaging tool position may correspond to a ground-engaging tool position in which the shank 50 penetrates the soil to a desired depth. In several embodiments, the predetermined ground-engaging tool position may be set by a mechanical stop 37. In operation, the biasing element 47 may permit relative movement between the shank 50 and the frame 28, For example, the biasing element 47 may be configured to bias the shank assembly 51 including the shank 50 to pivot relative to the frame 28 in a first pivot direction (e.g., as indicated by arrow 103 in FIG. 3) until an end 64 of the first attachment structure 39 of the shank assembly 51 contacts the stop 37. The biasing element 47 may also allow the shank 50 to pivot away from the predetermined ground-engaging tool position (e.g., to a shallower depth of penetration), such as in a second pivot direction (e.g., as indicated by arrow 101 in FIG. 3) opposite the first pivot direction 103, when encountering rocks or other impediments in the field. As shown in FIG. 3, the biasing element 47 may be configured as a spring. It should be recognized, however, the biasing element 47 may be configured as an actuator or any other suitable biasing element.

As further illustrated in FIG. 3, the shank 50 may further be pivotably coupled to the attachment structure of the shank assembly 51 at a second pivot point 60 to allow pivoting of the shank 50 relative to a component of the attachment structure about such point 60 independent of the pivotal motion allowed about the first pivot point 41 via the operation of the biasing element 47. More particularly, as shown in the illustrated embodiment, the shank 50 is pivotally coupled to the second attachment structure 56 of the attachment structure at the second pivot point 60, which, in turn, is coupled to the frame 28 at the first pivot point 41 via the first attachment structure 39. In such an embodiment, the shank 50 may be coupled to the second attachment structure 56 via an associated pivot member 62 (e.g., a pivot bolt or pin) extending through both the shank 50 and the attachment structure 56 at the second pivot point 60. Additionally, as shown, the biasing element 47 may be pivotably coupled to the frame 28 at a third pivot point 61 and pivotably coupled to the shank assembly 51 at a fourth pivot point 63, Moreover, an associated pivot member 65, 67, 69 (e.g., a pivot bolt or pin) may extend through each of the pivot points 41, 61, 63, respectively.

Additionally, as shown in FIG. 3, the shank assembly 51 may further include a shear pin or bolt 58 at least partially extending through both the attachment structure 56 and the shank 50 at a location separate from the pivot point 60 defined between such components. For instance, in the illustrated embodiment, the shear pin 58 is positioned above the pivot point 60 defined between the shank 50 and the adjacent attachment structure 56. In general, the shear pin 58 may be configured to prevent rotation of the shank 50 relative to the attachment structure 56 when the shear pin 58 is in an operable working condition, for instance when the shear pin 58 has not sheared or otherwise failed. In one embodiment, the shear pin 58 may correspond to a mechanical pin designed such that the pin breaks when a predetermined force is applied through the pin. For instance, the shear pin 58 may be designed to withstand normal or expected loading conditions for the shank 50 and fail when the loads applied through the pin 58 exceed or substantially exceed such normal/expected loading conditions.

During normal operation, the tip end 45 of the shank 50 may encounter impediments in the field causing the shank assembly 51 to rotate about the first pivot point 41 in the second pivot direction 101. Typically, the shank will pivot upwards in the second pivot direction 101 about the first pivot point 41 to clear the impediment and then will return to its home or ground-engaging position via the action of the biasing element 47. However, in certain situations, the shank assembly 51 may fully rotate until the attachment structure contacts the mechanical stop 37 without clearing the impediment, in which case a significant amount of force may be transmitted through the shank assembly 51. In such a situation, the shear pin 58 may be designed to fracture, thereby allowing the shank 50 to rotate about the second pivot point 60 relative to the attachment structure 56. For instance, the shank 50 may rotate about the second pivot point 60 (as indicated by arrow 105 in FIG. 3) to the shank position indicated by dashed lines in FIG. 3.

Referring still to the example embodiment of FIG. 3, in accordance with aspects of the present subject matter, the shank assembly 51 and/or shear pin 58 may include or define one or more electrical connections 66. For instance, the electrical connection 66 may be defined by or through the shear pin 58. As another example, the electrical connection 66 may be defined through the second attachment structure 56 and the shank (e.g., through the first attachment member 43, the shank 50, and the second attachment member 49). As a further example, the electrical connection 66 may be defined through the shank 50 and to the ground when the shank 50 is in the predetermined ground-engaging tool position. Moreover, the electrical connection(s) 66 may be configured to form a complete connection when the shear pin 58 is intact and/or the shank 50 is set to be in the predetermined ground-engaging tool position. As described below, the electrical connection(s) 66 may be electrically linked to a corresponding system controller 82 (FIG. 10) to allow the controller 82 to determine the working condition or a change in the working condition of the shear pin 58 as the associated agricultural operation is being performed. It should also be appreciated that, in general, the electrical connection(s) 66 may correspond to any electrical continuity that is complete and present while the shear bolt 58 is intact and the shank 50 is positioned in the predetermined ground-engaging tool position and is severed when the shear bolt 58 fails and/or the shank 50 is no longer positioned in the predetermined ground-engaging tool position.

As shown, FIG. 3 illustrates various examples of different electrical connections 66 (e.g., electrical connections 66A, 66B, and 66C) that may be used to monitor the presence of the shear pin 58. Thus, it should be appreciated that the shank assembly 51 need not include each of the electrical connections 66 shown in FIG. 3. For instance, embodiments of the disclosed shank assembly 51 may only include one of the electrical connections 66 described with reference to FIG. 3 to monitor the state of the shear pin 58. However, in other embodiments, a combination of the electrical connections 66 may be used to determine the state of the shear pin 58.

In one embodiment, as illustrated in FIG. 3 and described in more detail in reference to FIGS. 4-6 and 9, the electrical connection 66 may be defined through the shear pin 58 (represented by electrical connection 66A). As such, when the shear pin 58 fails, the electrical connection 66A through the shear pin 58 may be severed, indicating a failure of the shear pin 58. As another example, in an additional or alternative embodiment, as described in more detail in reference to FIGS. 7 and 8, the electrical connection 66 may be defined through the second attachment structure 56 and the shank 50 (represented by electrical connection 66B). For instance, when the shear pin 58 is intact, a complete electrical connection 66B may be defined from the first attachment member 43, through the shank 50, and to the second attachment member 49. However, when the shear pin 58 fails, the electrical connection 66B between the first attachment member 43 and/or the second attachment member 49 and the shank 50 may be severed, indicating a failure of the shear pin 58.

As yet another example, as shown in FIG. 3, the electrical connection 66 may be defined through the shank 50 to the ground (represented by electrical connection 66C) when the shank 50 is in the predetermined ground-engaging tool position. For instance, an electrical current and/or charge may be applied directly to the shank 50. For example, a trickle charge may be applied to the shank 50. Further, when the shear pin 58 is intact, a complete electrical connection 66C between the shank 50 and the ground may be established to discharge the current and/or charge applied to the shank 50. However, when the shear pin 58 fails, the electrical connection 66C between the shank 50 and ground may be severed such that a charge builds up on the shank 50, indicating a failure of the shear pin 58. In such an embodiment, it should be appreciated that the shank 50 may be electrically isolated or insulated from the remainder of the shank assembly 51. Further, it should be appreciated that in various embodiments described herein the shank assembly 51 may additionally or alternatively be electrically isolated or insulated from the structural frame member 38 and/or the toolbar 48 in embodiments where the shank assembly 51 is a part of a ganged tool assembly.

Figure 4:
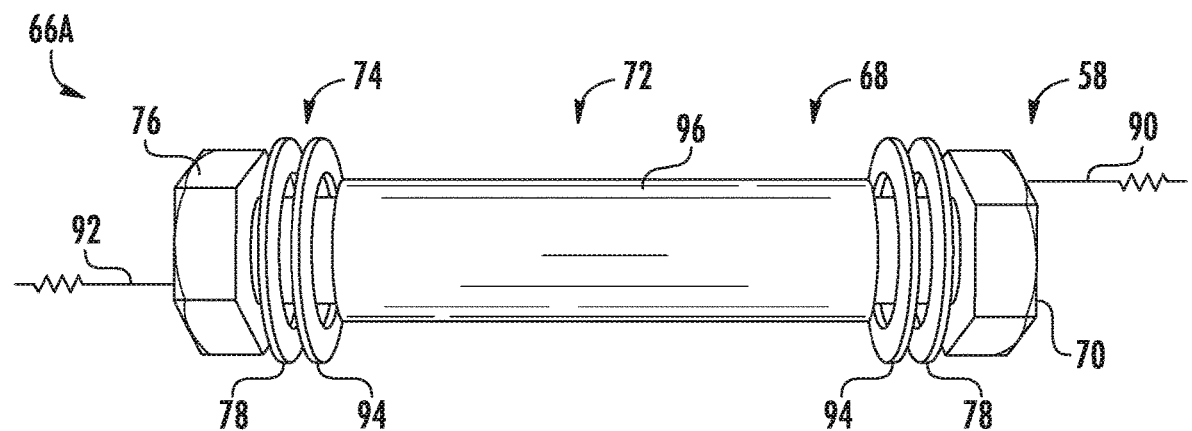
FIG. 4 illustrates an assembled view of one embodiment of an electrical connection through the shear pin in accordance with aspects of the present subject matter, particularly illustrating the shear pin where the electrical connection includes the shear pin.

Referring now to FIG. 4, an assembled view of one embodiment of the electrical connection 66A through the shear pin 58 is illustrated in accordance with aspects of the present subject matter. Particularly, FIG. 4 illustrates the shear pin 58 where the electrical connection 66A includes the shear pin 58. For instance, in the embodiment of FIG. 4, the shear pin 58 may include a bolt 68 with a head 70 and a shaft 72 extending from the head 72. Further, the shaft 72 may include threads at a distal end 74 such that the shaft 72 of the bolt 68 may be threaded to a nut 76 of the shear pin 58. Further, the shear pin 58 may include one or more washers 78 to secure the shear pin 58. For instance, washer(s) 78 may be placed on one or both sides of the second attachment structure 56, such as to the outside of the first structural member 43 and the outside of the second structural member 49 (FIG. 3). The shaft 72 of the bolt 68 may be inserted within a first washer 78, through the first structural member 43, through the shank 50, through the second structural member 49, through a second washer 78, and finally secured by the nut 76. As such, the shaft 72 of the bolt 68 may be configured to break or otherwise shear when the loads applied through the shear pin 58 exceeds or substantially exceeds the normal/expected loading conditions of the shank 50. While one embodiment of a shear pin 58 is illustrated in FIG. 4, it should be appreciated that other configurations of a shear pin 58 may occur to one of ordinary skill in the art and be equally applicable to the present disclosure. For instance a shear pin 58 may include the head 70 and shaft 72 extending through the second attachment structure 56 and shank 50 and be secured by a pin on the opposite side of the attachment structure 56.

Figure 10:
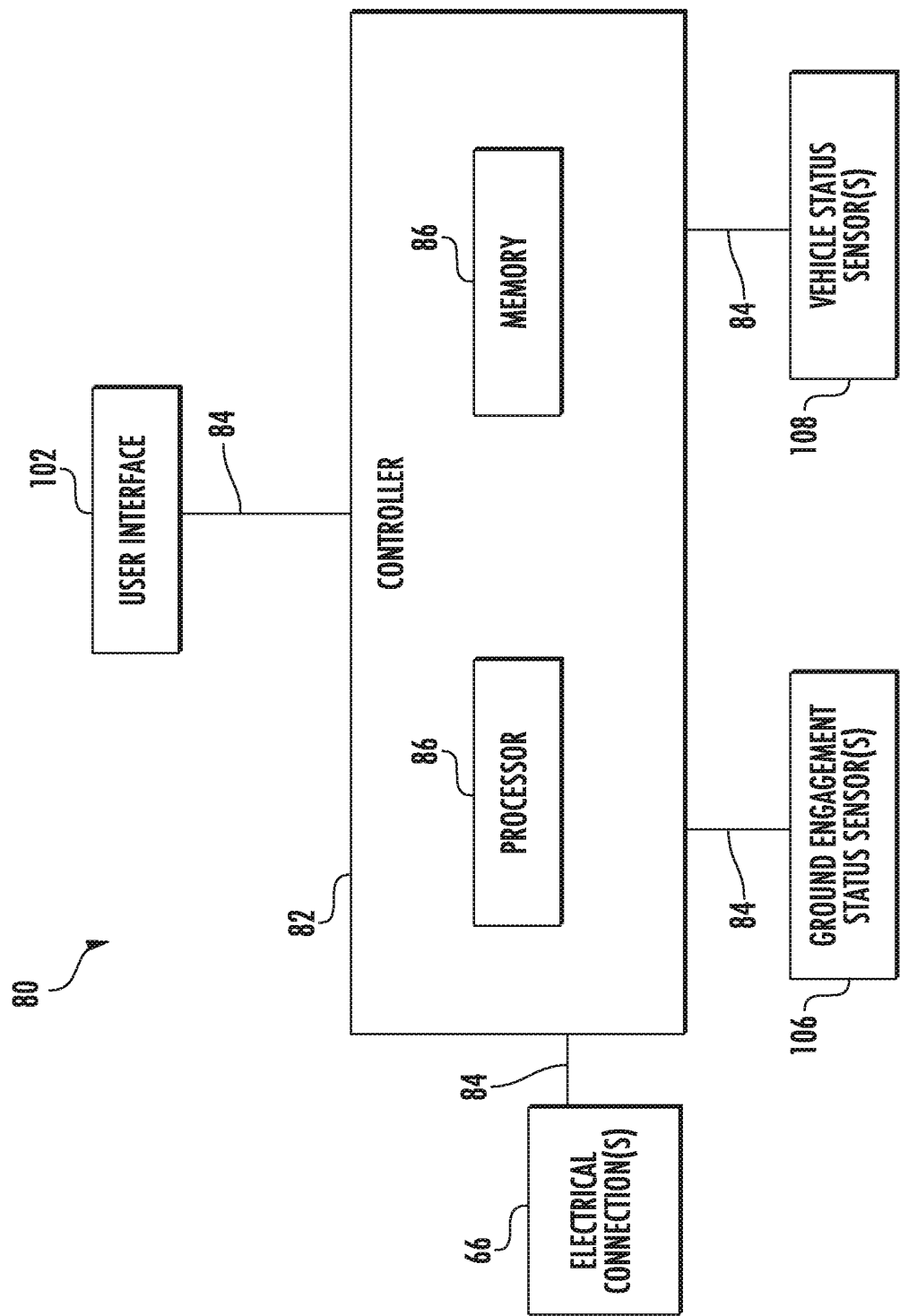
FIG. 10 illustrates a schematic view of one embodiment of a system for monitoring the operational status of a ground-engaging tool of an agricultural implement in accordance with aspects of the present subject matter.

As shown, a first electrical contact 90 may be coupled to the head 70 of the bolt 68, and a second electrical contact 92 be coupled to the nut 76. As such, the electrical contact 66A may be defined through the material (e.g., a material with a high electrical conductivity such as a metal) of the shear pin 58. Further, the first and second electrical contacts 90, 92 may be electrically coupled to the controller 82 (FIG. 10). As such, when the load applied to the shear pin 58 exceeds or substantially exceeds the normal/expected loading conditions of the shank 50, the shaft 72 of the shear pin 58 may break or otherwise sever and also sever the electrical connection 66A through the shear pin 58. As such, the severed electrical connection 66A may indicate a shear pin 58 failure. Additionally, the shear pin 58 may be electrically isolated from the remainder of the shank assembly 51. For instance, one or more isolation washers 94 may be arranged between the head 70 of the bolt 68 and the first attachment member 43 and the nut 76 and the second attachment member 49, respectively, such that the head 70 and nut 76 are electrically isolated from the second attachment structure 56. Further, an isolation sleeve 96 may be arranged around, the shaft 72 of the bolt 68 such that the shaft 72 is electrically isolated from the second attachment structure 56 and the shank 50. The isolation elements 94, 96 may include a nylon, a rubber, a polymer, an elastomer, or other similar substance with a low electrical conductivity. Further, in additional or alternative embodiments, the isolation elements 94, 96 may include one or more bushings, coatings, layers, or similar to electrically isolate the shear pin 58 from the shank assembly 51.

Figure 5:
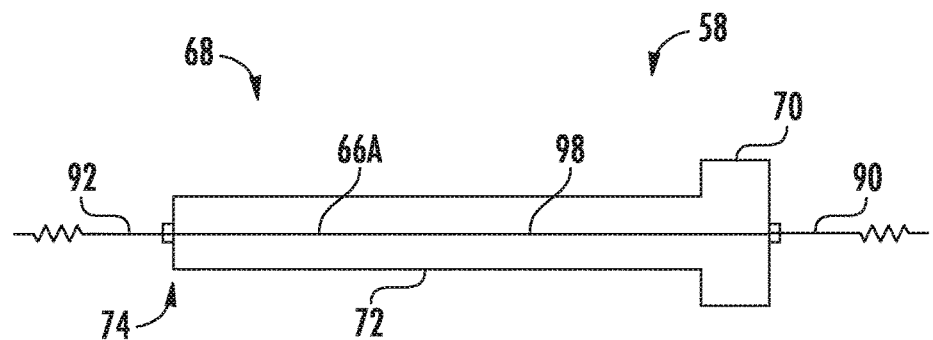
FIG. 5 illustrates a schematic view of an alternative embodiment of the electrical connection through the shear pin in accordance with aspects of the present subject matter, particularly illustrating the shear pin with an independent electrical component extending from a head of a bolt to a distal end of the bolt.
Figure 6:
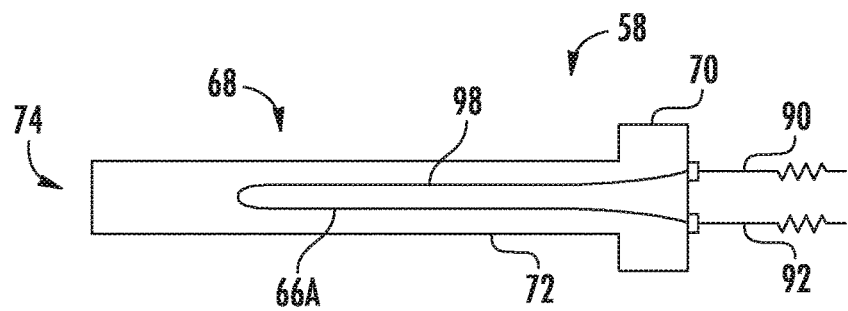
FIG. 6 illustrates a schematic view of a further embodiment of the electrical connection through the shear pin in accordance with aspects of the present subject matter, particularly illustrating the bolt of the shear pin with the independent electrical component looped through the shaft of the bolt.

Referring now to FIGS. 5 and 6, alternative embodiments of shear pins 58 are illustrated in accordance with aspects of the present subject matter. Particularly, FIG. 5 illustrates the bolt 68 of the shear pin with an independent electrical component extending from the head 70 of the bolt 68 to the distal end 74 of the bolt 68, and FIG. 6, illustrates the bolt 68 of the shear pin 58 with an independent electrical component looped through the shall 72 of the bolt 68. For instance, as shown in FIG. 5, the electrical connection 66A configured as independent electrical component 98 may extend fully through the entire bolt 68 (e.g., through the head 70 to the distal end 74 of the shaft 72) and be electrically coupled to the electrical contacts 90, 92. For instance, in one or more embodiments, the independent electrical component 98 may include a wire or any other suitable electrically conductive component. As such, when the load applied to the shear pin 58 exceeds or substantially exceeds the normal/ expected loading conditions of the shank 50, the shaft 72 of the shear pin 58 may break or otherwise sever and also sever the electrical connection 66A (independent electrical component 98) extending through the shear pin 58. Moreover, the severed electrical connection 66A may indicate a shear pin 58 failure. Similar to FIG. 5, as shown in FIG. 6, the electrical connection 66A configured as the independent electrical component 98 may partially extend through the shaft 72 of the bolt 68. For instance, the independent electrical component 98 may extend within the bolt 68 from the head 70 more than half of a length of the shaft 72 and loop back to the head 70. Further, the independent electrical component 98 may be electrically coupled to the electrical contacts 90, 92 on both ends of the loop. As such, when the load applied to the shear pin 58 exceeds or substantially exceeds the normal/expected loading conditions of the shank 50, the shaft 72 of the shear pin 58 may break or otherwise sever and also sever the electrical connection 66A (looped independent electrical component 98) extending through the shear pin 58. Moreover, the severed electrical connection 66A may indicate a shear pin 58 failure. It should also be appreciated that the independent electrical component 98 may be electrically insulated from the shear pin 58.

Figure 8:
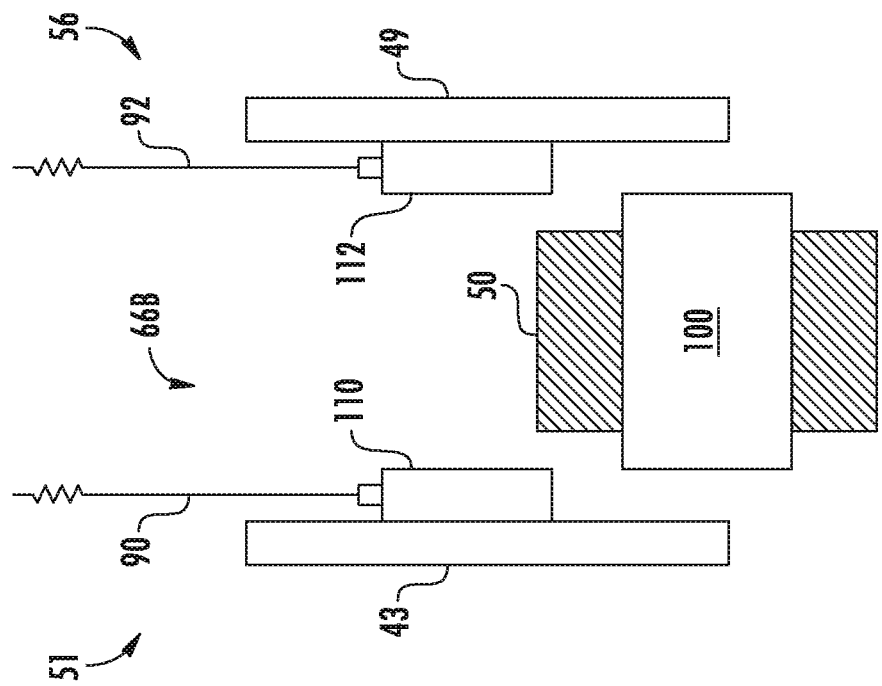
FIG. 8 illustrates another internal schematic view of the shank assembly of FIG. 7 in accordance with aspects of the present disclosure, particularly illustrating a severed electrical connection.
Figure 7:
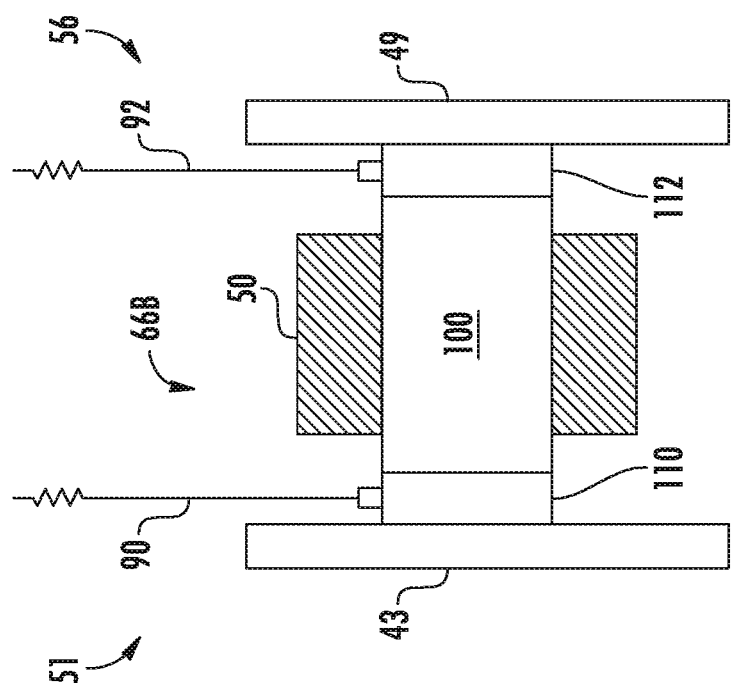
FIG. 7 illustrates an internal schematic view of the shank assembly including the electrical connection in accordance with aspects of the present disclosure, particularly illustrating a completed electrical connection.

Referring now to FIGS. 7 and 8, multiple internal, schematic views of the shank assembly 51 including the electrical connection 66B are illustrated in accordance with aspects of the present disclosure. Particularly, FIG. 7 illustrates a completed electrical connection 669, and FIG. 8 illustrates a severed electrical connection 66B. In the illustrated embodiments, an internal view of the second attachment structure 56 including the first attachment member 43 and second attachment member 49 are shown disposed on opposite sides of the shank 50. Further, a cross-section of shank 50 has been shown including a contact member 100 extending through the shank 50. The contact member 100 may generally include any conductive material, such as a rod or shaft formed from metal. Further, a first node 110 may be coupled to an interior surface of the first attachment member 43 facing the second attachment member 49. Similarly, a second node 112 may be coupled to an interior surface of the second attachment member 49 facing the first attachment member 43. Further, the first and second nodes 110, 112 may be electrically coupled to the electrical contacts 90, 92, respectively. Additionally, the contact member 100 and nodes 110, 112 may be electrically isolated or insulated from the attachment structure 56 and shank 50.

As shown particularly in FIG. 7, when the shear pin 58 is intact, the contact member 100 may be configured to make contact with both the first node 110 and the second node 112 and thus complete the electrical connection 66B. Specifically, a completed connection between the first node 110, the contact member 100, and the second node 112 may indicate the shear pin 58 is intact. As shown particularly in FIG. 8, when the load applied to the shear pin 58 exceeds or substantially exceeds the normal/expected, loading conditions of the shank 50, the shaft 72 of the shear pin 58 may break or otherwise sever. In such an instance, the shank 50 may rotate about the pivot point 60 in the direction 105 (FIG. 3) such that the shank 50 and contact member 100 are displaced from one or both of the nodes 110, 112, Moreover, such displacement may break or otherwise sever the electrical connection 66B through the contact member 100 and the nodes 110, 112. As such, the severed electrical connection 66B may indicate a shear pin 58 failure.

Figure 9:
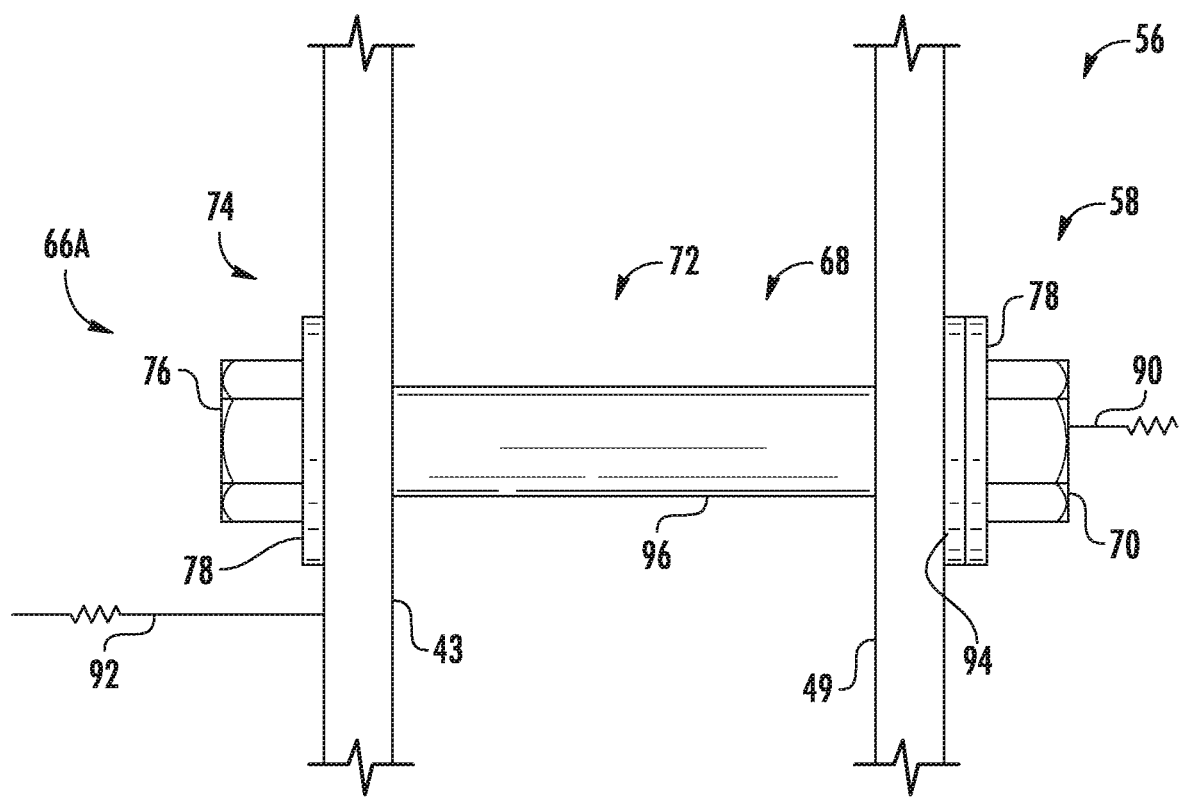
FIG. 9 illustrates an assembled, schematic view of one embodiment of the shear pin with an attachment structure of the shank assembly, particularly illustrating an embodiment of the electrical connection defined through the shear pin and the attachment structure.

Referring now to FIG. 9, an assembled, schematic view of one embodiment of the shear pin 58 assembled with the second attachment structure 56 is illustrated in accordance with aspects of the present subject matter. Particularly, FIG. 9 illustrates an additional or alternative embodiment of the electrical connection 66A defined through both the shear pin 58 and the second attachment structure 56. In such an embodiment, the shear pin 58 may only need to be isolated from the second attachment structure 56 on one end. For instance, between either of the head 70 and the second structural member 49 or between the nut 76 at the distal end 74 and the first structural member 43. Further, such an arrangement allows for the second attachment structure 56 to be formed as a single casing or component without the need to electrically isolate and/or insulate the first structural member 43 from the second structural member 49.

For example, as illustrated in FIG. 9, the first electrical contact 90 may be coupled to the head 70 of the bolt 68, and the second electrical contact 92 may be coupled to the second attachment structure 46. In the illustrated embodiment, the second electrical contact 92 is shown as coupled to the first structural member 43, but it should be appreciated that the second electrical contact 92 may be coupled to the second attachment structure 56 at any suitable position of the first or second attachment members 43, 49. Additionally, as explained generally above, the first and second electrical contacts 90, 92 may be electrically coupled to the controller 82 (FIG. 10). As such, when the load applied to the shear pin 58 exceeds or substantially exceeds the normal/expected loading conditions of the shank 50, the shaft 72 of the shear pin 58 may break or otherwise sever and also sever the electrical connection 66A through the shear pin 58 to the second attachment structure 56. As such, the severed electrical connection 66A may indicate a shear pin 58 failure. Additionally, the shear pin 58 may be electrically isolated from the remainder of the shank assembly 51 at one of the head 70 or the nut 76. For instance, one or more isolation washers 94 may be arranged between the head 70 of the bolt 68 and the first attachment member 43 or the nut 76 and the second attachment member 49, such that at least one of the head 70 or nut 76 are electrically isolated from the second attachment structure 56. Further, an isolation sleeve 96 may be arranged around the shaft 72 of the bolt 68 such that the shaft 72 is electrically isolated from the second attachment structure 56. While in the illustrated embodiment the head 70 is illustrated as isolated from second attachment member 49, it should be appreciated that in other embodiments the nut 76 may be electrically isolated from the first attachment member 43, such as via one or more of the isolation washers 94. Furthermore, in such an embodiment, the electrical connection 66A may be made between the head 70 and the second attachment member 49. Additionally, in such an embodiment, the first electrical contact 90 may be coupled to the nut 76 of the shear pin 58.

Referring now to FIG. 10, a schematic view of one embodiment of a system 80 for monitoring the operational status of a ground-engaging tool of an agricultural implement is illustrated in accordance with aspects of the present subject matter. In general, the system 80 will be described herein with reference to the embodiment of the implement 10 described above with reference to FIGS. 1 and 2 and, in particular, the shank assembly 51 and electrical connection(s) 66 (e.g., electrical connections 66A, 66B, and/or 66C) described above with reference to FIGS. 3-9). However, it should be appreciated that, in general, the disclosed system 80 may be utilized with any suitable implement having any suitable implement configuration to allow a connectivity through the electrical connection(s) 66 to be monitored. Connectivity, as used herein, may generally correspond to an ability of the component to carry an electrical current. Moreover, it should be appreciated that aspects of the disclosed system 80 may also be utilized with any other suitable ground-engaging tools of a given agricultural implement.

As shown, the system 80 may generally include a controller 82 configured to be electrically coupled (via one or more electrical links 84) to one or more of the electrical connections 66 defined relative to the ground-engaging tools of the associated implement. For instance, with reference to the embodiment of the shank assembly 51 described above, an electrical connection(s) 66 (e.g., one or more of the electrical connections 66A, 66B, and 66C described in FIGS. 3-9) may be installed or defined in operative association with each of a plurality of different shank assemblies 51 of the agricultural implement 10. In such an embodiment, the controller 82 may be electrically coupled to each of such electrical connections 66, thereby allowing the controller 82 to monitor the connectivity through the electrical connection(s) 66 associated with each shank 50.

In general, the controller 82 may comprise any suitable processor-based device known in the art, such as a computing device or any suitable combination of computing devices. Thus, in several embodiments, the controller 82 may include one or more processor(s) 86 and associated memory device(s) 88 configured to perform a variety of computer-implemented functions. As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 88 of the controller 82 may generally comprise memory element(s) including, but not limited to, a computer readable medium (e.g., random access memory (RAM)), a computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 88 may generally be configured to store suitable computer-readable instructions that, when implemented by the processor(s) 86, configure the controller 82 to perform various computer-implemented functions, such as one or more aspects of the method 200 described below with reference to FIG. 11. In addition, the controller 82 may also include various other suitable components, such as a communications circuit or module, one or more input/output channels, a data/control bus and/or the like.

It should be appreciated that the controller 82 may correspond to an existing controller of the implement 10 or the work vehicle 12, or the controller 82 may correspond to a separate processing device. For instance, in one embodiment, the controller 82 may form all or part of a separate plug-in module that may be installed within the implement 10 or the work vehicle 12 to allow for the disclosed system and method to be implemented without requiring additional software to be uploaded onto existing control devices of the implement 10 or the work vehicle 12.

As illustrated in FIG. 10, the system 80 may generally include one or more sensors configured to allow the controller 82 to determine the implement 10 and shank assembly(ies) 51 are in a working condition. For example, one or more ground-engagement status sensors 106 or vehicle status sensors 108 may be communicatively coupled (via one or more communicative links 84) to the controller 82. For instance, a ground-engagement sensor(s) 106 may be provided in operative association with each of a plurality of different shank assemblies 51 of the agricultural implement 10. The ground-engagement sensor(s) 106 may allow the controller 82 to monitor the position of the shank assemblies 51 to determine that the shank assemblies 51 are in an operating position (e.g., such that each shank 50 is configured to be in the predetermined ground-engaging tool position). In certain embodiments, the ground-engagement sensor(s) 106 may include a depth sensor. However, in additional or alternative embodiments, the ground-engagement sensor(s) 106 may include any sensor suitable to determine whether the shank assembly(ies) 51 is in the operating position. Further, a vehicle status sensor(s) 108 may be provided in operative association with the implement 10 and/or the work vehicle 12. The vehicle status sensor(s) 108 may allow the controller 82 to monitor the speed and/or position of the agricultural implement 10 and/or work vehicle 12 to determine whether the agricultural implement 10 is in an operating status (e.g., is moving across the field). For example, the vehicle status sensor(s) 108 may include one or more global positioning system ("GPS") or ground speed radar sensors provided in operative association with at least one of the implement 10 or work vehicle 12. However, in additional or alternative embodiments, the vehicle status sensor(s) 108 may include any sensor suitable to determine the agricultural implement 10 is in the operating status.

By monitoring the connectivity of the electrical connection(s) 66 associated with the presence of the shear pin 58, the controller 82 may be configured to estimate or determine when a change in the working condition of the associated shear pin 58 (FIG. 3) occurs based on the connectivity, or lack thereof, through the electrical connection(s) 66. For instance, when the shank 50 is in an engaged position with the field and the shear pin 58 is in an operable working condition, the electrical connection(s) 66 may be intact such that a current flows through the electrical connection(s) 66. As such, the detected electrical connectivity of the electrical connection(s) 66 may indicate that the shear pin 58 is intact or in a working condition. However, when the force applied on the shank 50 is large enough to break or shear the shear pin 58, the shank 50 may freely rotate about the pivot point 60 defined between the shank 50 and the adjacent attachment structure 56 and thereby sever the electrical connection(s) 66. In such instance, the electrical connectivity of the electrical connection(s) 66 may be reduced significantly, e.g., such connectivity may be entirely or substantially eliminated.

In several embodiments, to determine when there has been a change in the working condition of the shear pin 58 from its otherwise operable working condition (e.g., due to the shear pin 58 shearing off or otherwise failing), the controller 82 may be configured to compare an electrical property of the electrical connection(s) 66 based on the electrical signal received from the electrical connection(s) 66 to a predetermined threshold. Specifically, the controller 82 may be configured to determine that there has been a change in the working condition of the shear pin 58 based on a difference between the monitored electrical property of the electrical connection(s) 66 by the controller 82 and the predetermined threshold.

In one embodiment, the electrical property may be a connectivity or resistance of the electrical connection(s) 66, such as electrical connection(s) 66A and/or 66B. In one embodiment, the predetermined threshold may be a predetermined connectivity threshold and/or predetermined resistance threshold selected so as to correspond to intact electrical connection 66. For instance, a resistance indicative of a severed electrical connection 66A, 66B may correspond to a very high or nearly infinite resistance. As such, a resistance threshold may be stored within the memory 88 of the controller such that the controller 82 may identify the electrical connection(s) 66 has been severed when the resistance of the electrical connection(s) 66 exceeds the resistance threshold. In certain embodiments, the resistance threshold may be selected as finite number, such as double or triple the expected resistance of an intact electrical connection(s) 66. As another example, the connectivity of a severed electrical connection 66A, 66B may correspond to a very low or nearly zero current through the electrical connection 664, 66B. As such, a connectivity threshold may be stored within the memory 88 of the controller such that the controller 82 may identify the electrical connection(s) 66 has been severed when the current through the electrical connection(s) 66 falls below the connectivity threshold. In certain embodiments, the connectivity threshold may be selected as finite number, such as half or a third of the expected current through an intact electrical connection(s) 66. In one or more embodiments, the predetermined threshold may account for changes in the electrical connection 66 due to oxidation or galvanization. For instance, the predetermined threshold value may be at least partially determined by the age of the electrical connection 66 (e.g., based upon the last time the components of the electrical connection 66 have been replaced) in order to take into account a likely change in the degree of oxidation and/or galvanization of the electrical connection 66.

In another embodiment, the electrical property may be a voltage between a current source, such as the controller 82, and the electrical connection(s) 66, such as electrical connection 66C. As explained in reference to FIG. 3, an electrical charge or current, such as trickle charge, may be applied to the shank 50 (acting as the electrical connection 66C). Further, when the shear pin 58 is intact, a complete electrical connection 66C between the shank 50 and the ground may be established to discharge the current and/or charge applied to the shank 50. As such, a voltage may exist between the current source and the electrical connection 66C. However, when the shear pin 58 fails, the electrical connection 66C between the shank 50 and ground may be severed such that a charge builds up on the shank 50. In such a situation, the voltage between the current source and the electrical connection 66C may steadily reduce as the charge is retained by the shank 50. For instance, the voltage may tend to zero or approximately zero. Further, the controller 82 may be configured to monitor this voltage between the electrical connection 66C and the current source.

As such, a voltage threshold may be stored within the memory 88 of the controller 52 such that the controller 82 may identify the electrical connection(s) 66C has been severed when the voltage between the current source and the electrical connection(s) 66C falls below the voltage threshold. In certain embodiments, the voltage threshold may be selected as finite number, such as half or a third of the expected voltage between the current source and an intact electrical connection(s) 66C.

As shown in FIG. 9, the system 80 may also include a user interface 102 communicatively coupled to the controller 82. In one embodiment, the user interface 102 may be configured to provide feedback (e.g., notifications associated with status of the tools being monitored (e.g., one or more of the shanks 50) to the operator of the implement 10. For instance, the controller 82 may be configured to alert the operator of a change in the working condition of one or more of the shear pins 58, such as when it is determined that a given shear pin 58 has failed due to the changed in the monitored electrical property of the electrical connection(s) 66, thereby allowing the operator to make a determination as to whether it is necessary to stop the operation of the implement 10 to check the status of the associated shear pin(s) 58. Such notifications to the operator may be particularly advantageous in situations in which the shear pin 58 has failed, but the shank 50 has not rotated backwards relative to the adjacent attachment structure to a noticeable degree (e.g., due to friction between the shank 50 and the attachment structure). In such instances, an operator visually examining the ground-engaging tools may not recognize that one or more of the shear pins 58 are no longer in the operable working condition. Accordingly, alerting the operator of changes to the working condition of the shear pins 58 allows for accurate and timely detection of shear pin failures.

It should be appreciated that the user interface 102 may include or be associated with one or more feedback devices (not shown), such as display screens, speakers, warning lights, and/or the like, which are configured to communicate such feedback. In one embodiment, the controller 82 may be configured to generate an interface element for display to an operator on the user interface 102. In such an embodiment, the interface element may, for example, be associated with a visual indicator indicative of the working condition of tools being monitored (e.g., by indicating a change in the working condition of the shear pin 58 associated with one of the monitored tools). It should be appreciated that the controller 82 may be configured to generate a separate interface element for each shear pin 58 associated with the various ground-engaging tools of the implement 10 or may generate a single interface element representing the working condition of multiple shear pins 58. In addition, some embodiments of the user interface 102 may include one or more input devices (not shown), such as touchscreens, keypads, touchpads, knobs, buttons, sliders, switches, mice, microphones, and/or the like, which are configured to receive user inputs from the operator. In one embodiment, the user interface 102 may be positioned within the operator's cab 22 of the work vehicle 12. However, in alternative embodiments, the user interface 102 may have any suitable configuration and/or be positioned in any other suitable location.

In additional or alternative embodiments, the controller 82 may be configured to implement a control action in response to a change in the working condition of one or more of the shear pins 58. For example, the controller 82 may communicate a signal to stop movement of the work vehicle 12 and/or raise one or more of the ground-engaging tools of the implement 10. As such, by implementing the control action, the system 80 may prevent cultivation of portions of the field while one or more ground-engaging tools are not engaging the soil due to, for example, a sheared or broken shear pin(s) 58.

Figure 11:
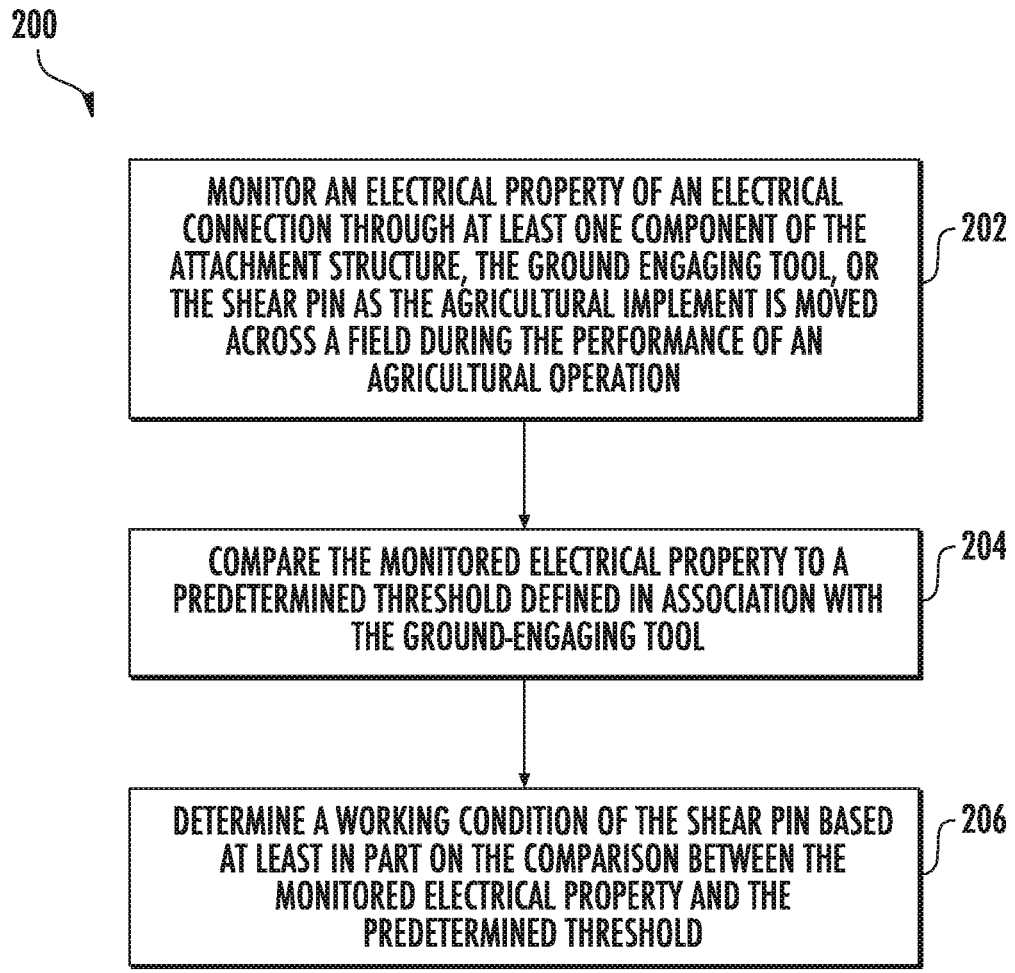
FIG. 11 illustrates a flow diagram of one embodiment of a method of monitoring the operational status of a ground-engaging tool of an agricultural implement in accordance with aspects of the present subject matter.

Referring now to FIG. 11, a flow diagram of one embodiment of a method 200 of monitoring the operational status of a ground-engaging tool of an agricultural implement is depicted in accordance with aspects of the present subject matter. In general, the method 200 will be described herein with reference to the implement 10 and the system 80 and associated components described above with reference to FIGS. 1-10. However, it should be appreciated by those of ordinary skill in the art that the disclosed method 200 may generally be utilized to determine the operational status of a ground-engaging tool associated with any agricultural implement having any suitable implement configuration and/or any system having any suitable system configuration. In addition, although FIG. 11 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 11, at (202), the method 200 may include monitoring an electrical property of an electrical connection through at least one component of the attachment structure, the ground-engaging tool, or the shear pin as the agricultural implement is moved across a field during the performance of an agricultural operation. For example, the ground-engaging tool may include a shank 50. In such an arrangement, monitoring the electrical property of the electrical connection(s) 66 may include monitoring the electrical property of the electrical connection(s) 66 as the shank 50 is being pulled through the ground during the performance of the agricultural operation. For example, as indicated above, the system controller 82 may be configured to monitor the connectivity or resistance of the electrical connection(s) 66 and/or a voltage between the electrical connection(s) 66 and the current source.

In at least one embodiment, prior to monitoring the electrical property of the electrical connection(s) 66, the method 200 may include determining the implement 10 and shank assembly(ies) 51 are in a working condition. For example, as described above, the controller 82 may be configured to monitor the position of the shank assembly(ies) 51 based on sensor data received from one or more ground-engagement status sensors 106 to determine whether the shank assembly(ies) 51 are in an operating positon (e.g., such that each shank 50 is configured to be in the predetermined ground-engaging tool position). Further, the controller 82 may be configured to monitor the position and/or speed of the agricultural implement 10 or work vehicle 12 based on sensor data received from one or more vehicle status sensors 108 to determine whether the agricultural implement 10 is in an operating status (e.g., is moving across the field).

As further shown in FIG. 11, at (204) the method 200 may include comparing the monitored electrical property to a predetermined threshold defined in association with the ground-engaging tool. For instance, the monitored electrical property may be a resistance of the electrical connection 66, and the predetermined threshold may be a resistance threshold. The resistance threshold may be selected to correspond to maximum condition of the electrical connection 66 indicating the electrical connection 66 is intact. More particularly, in one embodiment, resistance threshold may correspond to resistance equal to or greater than double or triple the expected resistance of an intact electrical connection 66. In a further embodiment, the monitored electrical property may be a connectivity of the electrical connection 66, and the predetermined threshold may be a connectivity threshold. The connectivity threshold may be selected to correspond to minimum condition of the electrical connection 66 indicating the electrical connection 66 is intact. More particularly, in one embodiment, the connectivity threshold may correspond to a current equal to or less than half or a third of the expected current through an intact electrical connection 66.

In a still further embodiment, the monitored electrical property may be a voltage between a current source and the electrical connection 66, and the predetermined threshold may be a voltage threshold. The voltage threshold may be selected to correspond to minimum condition of the electrical connection 66 indicating the electrical connection 66 is intact. More particularly, in one embodiment, voltage threshold may correspond to a voltage between the current source and the electrical connection 66 equal to or less than half or a third of the expected voltage between the current source and an intact electrical connection 66.

Moreover, as shown in FIG. 10, at (206), the method 200 may include determining a working condition of a shear pin based at least in part on the comparison between the monitored electrical property and the predetermined threshold.

Specifically, as indicated above, the system controller 82 may be configured to analyze the electrical property of the electrical connection 66 to determine the working condition of the associated shear pin 58. In one embodiment, determining the working condition of the shear pin 58 may include determining whether the shear pin 58 has sheared off or failed.

In one embodiment, determining the working condition of the shear pin 58 may include determining that the shear pin 58 is in an operable working condition when the monitored resistance of the electrical connection 60 is less than the resistance threshold. In another example, determining the working condition of the shear pin 58 may include determining that the shear pin 58 is in an operable working condition when the monitored current through the electrical connection 60 is greater than the connectivity threshold. In a still further embodiment, determining the working condition of the shear pin 58 may include determining that the shear pin 58 is in an operable working condition when the monitored voltage between the current source and the electrical connection is greater than the voltage threshold.

Further, the method 200 of FIG. 11 may also include alerting an operator of the agricultural implement 10 of a change in the working condition of the shear pin 58. For instance, the method 200 may include generating an interface element for display to an operator on a user interface 102. More specifically, the system controller 82 may be configured to produce the interface element for display on the user interface 102. As indicated above, in one embodiment, the interface element may be associated with a visual indicator of the working condition of the shear pin 58. Additionally, the method 200 may include implementing a control action in response to the change in the working condition of the shear pin 58. For example, the system controller 82 may communicate a signal to stop movement of the work vehicle 12 and/or raise one or more of the ground-engaging tools of the implement 10.

It is to be understood that the steps of the method 200 is performed by the controller 82 upon loading and executing software code or instructions Which are tangibly stored on a tangible computer readable medium, such as on a magnetic medium, e.g., a computer hard drive, an optical medium, e.g., an optical disc, solid-state memory, e.g., flash memory, or other storage media known in the art. Thus, any of the functionality performed by the controller 82 described herein, such as the method 200, is implemented in software code or instructions which are tangibly stored on a tangible computer readable medium. The controller 82 loads the software code or instructions via a direct interface with the computer readable medium or via a wired and/or wireless network. Upon loading and executing such software code or instructions by the controller 82, the controller 82 may perform any of the functionality of the controller 82 described herein, including any steps of the method 200 described herein.

The term "software code" or "code" used herein refers to any instructions or set of instructions that influence the operation of a computer or controller. They may exist in a computer-executable form, such as machine code, which is the set of instructions and data directly executed by a computer's central processing unit or by a controller, a human-understandable form, such as source code, which may be compiled in order to be executed by a computer's central processing unit or by a controller, or an intermediate form, such as object code, which is produced by a compiler. As used herein, the term "software code" or "code" also includes any human-understandable computer instructions or set of instructions, e.g., a script, that may be executed on the fly with the aid of an interpreter executed by a computer's central processing unit or by a controller.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A system for monitoring an operational status of ground-engaging tools of an agricultural implement, the system comprising:
    a frame;
    an assembly including an attachment structure configured to be coupled to the frame and a ground-engaging tool pivotably coupled to the attachment structure at a pivot point;
    a shear pin at least partially extending through both the attachment structure and the ground-engaging tool to prevent pivoting of the ground-engaging tool about the pivot point when the shear pin is in an operable working condition;
    an electrical connection through the shear pin; and
    a controller electrically coupled to the electrical connection, the controller configured to determine a change in the working condition of the shear pin based on an electrical property of the electrical connection.

2. The system of claim 1, wherein the ground-engaging tool comprises a shank.

3. The system of claim 1, wherein the change in the working condition of the shear pin corresponds to a shearing of the shear pin.

4. The system of claim 1, wherein the electrical property includes at least one of a connectivity or resistance.

5. The system of claim 4, wherein the controller is configured to determine there has been a change in the working condition of the shear pin when the resistance across the electrical connection exceeds a resistance threshold.

6. The system of claim 4, wherein the controller is configured to determine there has been a change in the working condition of the shear pin when a current across the electrical connection falls below a connectivity threshold.

7. The system of claim 1, wherein the controller is configured to generate an interface element for display to an operator on a user interface, the interface element providing a visual indicator associated with the working condition of the shear pin.

8. The system of claim 1, wherein the attachment structure includes a first attachment member on a first side of the ground-engaging tool and a second attachment member on a second side of the ground-engaging tool, and wherein the electrical connection comprises a first node coupled to the first attachment member, a second node coupled to the second attachment member, and a contact member extending through the ground-engaging tool and configured to contact both the first node and the second node when the ground-engaging tool is in the operable working condition, and wherein the contact member is configured to be displaced from at least one of the first node or the second node when the ground-engaging tools in a non-operable working condition.

9. The system of claim 1, wherein the electrical connection comprises the ground-engaging tool electrically grounded to a soil surface when the ground-engaging tool is in the operable working condition.

10. The system of claim 1, wherein the controller is configured to determine there has been a change in the working condition of the shear pin when a voltage across the electrical connection falls below a voltage threshold.

11. A method of monitoring an operational status of a ground-engaging tool pivotally coupled to a frame of an agricultural implement at a pivot point, the ground-engaging tool coupled to the frame of the implement via an attachment structure, and wherein a shear pin at least partially extends through the ground-engaging tool and the attachment structure, the method comprising:
    monitoring, with a computing device, at least one of conductivity or resistance of an electrical connection including a first node, a second node, and a contact member positioned between the first node and the second node, the contact member positioned through at least one component of the ground-engaging tool or the shear pin as the agricultural implement is moved across a field during a performance of an agricultural operation;
    comparing, with the computing device, the at least one of conductivity or resistance of the electrical connection to a predetermined threshold defined in association with the ground-engaging tool; and
    determining, with the computing device, a working condition of the shear pin based at least in part on the comparison between the monitored electrical property and the predetermined threshold.

12. The method of claim 11, further comprising:
    at least one of alerting an operator of the agricultural implement of a change in the working condition of the shear pin or implementing a control action in response to the change in the working condition of the shear pin.

13. The method of claim 11, wherein the ground-engaging tool comprises a shank, wherein monitoring the electrical property of the electrical connection through at least one component of the attachment structure, the ground-engaging tool, or the shear pin comprises monitoring the electrical property of the electrical connection through at least one component of the attachment structure, the shank, or the shear pin as the shank is being pulled through the ground during the performance of the agricultural operation.

14. The method of claim 11, wherein the electrical connection comprises at least one of the shear pin or independent electrical component associated with the shear pin, and wherein determining the working condition of the shear pin comprises determining the working condition of the shear pin based at least in part on a comparison between at least one of a connectivity or a resistance of the electrical connection and at least one of a resistance threshold or a connectivity threshold.

15. The method of claim 11, wherein the attachment structure includes a first attachment member on a first side of the ground-engaging tool and a second attachment member on a second side of the ground-engaging tool, and wherein the first node is coupled to the first attachment member, the second node is coupled to the second attachment member, and the contact member extends through the ground-engaging tool and is configured to contact both the first node and the second node when the ground-engaging tool is in the operable working condition.

16. The method of claim 11, wherein the electrical connection comprises the ground-engaging tool configured to be electrically grounded to the field when the ground-engaging tool is in the operable working condition and in a predetermined ground-engaging tool position, and wherein determining the working condition of the shear pin comprises determining the working condition of the shear pin based at least in part on a comparison between a voltage of the electrical connection and a voltage threshold when the ground-engaging tool is in the predetermined ground-engaging tool position.

17. The method of claim 11, wherein determining the working condition of the shear pin comprises determining whether the shear pin has sheared.

18. The method of claim 11, wherein the shear pin is configured to prevent pivoting of the ground-engaging tool about the pivot point when the shear pin is in an operable working condition.

19. The method of claim 11, further comprising:
    generating, with the computing device, an interface element for display to an operator on a user interface, the interface element associated with a visual indicator of the working condition of the shear pin.

20. A method of monitoring an operational status of a ground-engaging tool pivotally coupled to a frame of an agricultural implement at a pivot point, the ground-engaging tool coupled to the frame of the implement via an attachment structure that includes a first attachment member on a first side of the ground-engaging tool and a second attachment member on a second side of the ground-engaging tool, and wherein a shear pin at least partially extends through the ground-engaging tool and the attachment structure, the method comprising:
    monitoring, with a computing device, an electrical property of an electrical connection that includes a first node coupled to the first attachment member, a second node coupled to the second attachment member, and a contact member extending through the ground-engaging tool and configured to contact both the first node and the second node when the ground-engaging tool is in the operable working condition as the agricultural implement is moved across a field during the performance of an agricultural operation;
    comparing, with the computing device, the monitored electrical property to a predetermined threshold defined in association with the ground-engaging tool; and
    determining, with the computing device, a working condition of the shear pin based at least in part on the comparison between at least one of a connectivity or a resistance of the electrical connection and at least one of a connectivity threshold or resistance threshold.

* * * * *